United States Patent [19]
Yatsurugi et al.

[11] 4,150,168
[45] Apr. 17, 1979

[54] METHOD AND APPARATUS FOR MANUFACTURING HIGH-PURITY SILICON RODS

[75] Inventors: Yoshifumi Yatsurugi, Fujisawa; Atsushi Yusa, Ninomiya; Nagao Takahashi, Hiratsuka, all of Japan

[73] Assignee: Kabushiki Kaisha Komatsu Seisakusho, Tokyo, Japan

[21] Appl. No.: 882,817

[22] Filed: Mar. 2, 1978

[30] Foreign Application Priority Data

Mar. 2, 1977 [JP] Japan ................................. 52-21473

[51] Int. Cl.$^2$ ............................................. B05D 5/12
[52] U.S. Cl. ......................................... 427/51; 264/81; 156/611; 427/86; 423/349; 423/350; 118/49.5
[58] Field of Search ............... 427/51, 86, 87; 264/81; 118/48, 49, 49.1, 49.5; 156/611, 613

[56] References Cited

U.S. PATENT DOCUMENTS

| | | |
|---|---|---|
| 3,011,877 | 12/1961 | Schweickert ........................ 422/129 |
| 3,053,638 | 9/1962 | Reiser ..................................... 427/51 |
| 3,099,534 | 7/1963 | Schweickert ........................ 423/346 |
| 3,147,141 | 9/1964 | Ishizuka ............................... 118/49.1 |

*Primary Examiner*—Sam Silverberg
*Attorney, Agent, or Firm*—Armstrong, Nikaido, Marmelstein & Kubovcik

[57] ABSTRACT

A method of manufacturing high-purity silicon rods by subjecting a silicon compound to pyrolysis on a plurality of rod-shaped high-purity silicon carrier members which have been red-heated by directly passing an electric current therethrough thereby depositing high-purity silicon thereon, characterized in that monosilane supplied into a pyrolysis container is subjected to pyrolysis or thermal decomposition on said red-heated carrier members while insulating the radiant heat between said red-heated carrier members along the overall length thereof.

6 Claims, 2 Drawing Figures

METHOD AND APPARATUS FOR MANUFACTURING HIGH-PURITY SILICON RODS

BACKGROUND OF THE INVENTION

1. Field of the Invention

This invention relates to a method and apparatus for manufacturing semi-conductive high-purity silicon rods by subjecting monosilane to pyrolysis on red-heated, elongated silicon carrier members thereby depositing high-purity silicon thereon.

2. Description of the Prior Art

Semi-conductive, high-purity silicon rods have heretofore been manufactured by pyrolyzing or reducing by hydrogen a gaseous silicon compound such as, for example, monosilane, silicon tetrachloride, trichlorosilane or the like, which has been refined on rod-shaped and red-heated silicon carrier members or on a high-melting point metal having good electric conductivity such as, for example, tantalum wire, thereby depositing high-purity silicon on the carrier members. Such representative method and apparatuses for producing high-purity silicon rods are already disclosed in U.S. Pat. Nos. 3,099,534, 3,011,877, 3,053,638 and 3,147,141. However, in the case of subjecting the above-mentioned monosilane ($SiH_4$) to pyrolysis thereby producing high-purity silicon rods, there occurs a reaction of decomposition inherent in monosilane which can not be observed in the decomposition reaction of halides ($SiCl_4$, $SiHCl_3$ etc.), and therefore problems as mentioned hereinbelow) arose even when the above-mentioned method and apparatus are employed.

The reaction of decomposition of monosilane at an elevated temperature differs from that of halides at a high temperature, and the most outstanding difference between them exists in homogeneous reaction speed in gaseous or vapor phase. Monosilane is thermally decomposed by either homogeneous reaction in gaseous phase or heterogeneous reaction, and the reaction required for manufacturing silicon rods is mainly the heterogeneous reaction which takes place on the surface of the red-heated silicon rods. The higher the density and temperature of monosilane in gaseous phase, the higher the speed of homogeneous reaction in gaseous phase and heterogeneous reaction. The dependance of the reaction speed on temperature conditions in the homogeneous reaction in gaseous phase is far greater than that in the heterogeneous reaction. According to a chemical engineering observation, such phenomenon is promoted with the increase of the diameter of high-purity silicon rods which are being manufactured so that the growth speed of silicon on the opposite faces of the red-heated silicon rods will increase as the diameter of the silicon rods. As a result, the diameter of the silicon rods in the cross-section thereof becomes more uneven.

Whilst, the silicon rods used in the float zone melting process are usually molded to have a uniform diameter or approximately perfect roundness by scraping off uneven parts of the silicon rods with a view of preventing occurrence of possible accidents resulting from the irregular shape thereof during the float zone melting process. As mentioned above, the unevenness in the diameters of silicon rods in the cross-section thereof tends to reduce the yield thereof when used as the raw material for single-crystal silicon. Furthermore, with the increase of the diameter of each red-heated silicon rod, besides the deposition of silicon on the surface of growing silicon, the amount of deposition of powdery silicon on the interior wall of the pyrolysis container will increase. The powdery silicon is produced by the aforementioned homogeneous reaction in gaseous phase, and it is envisaged that as the diameter of each of the red-heated silicon rods increase, the temperature of the gaseous phase increases correspondingly so as to promote the homogeneous reaction in gaseous phase. As a result, with the increase of the homogeneous reaction in gaseous phase, the heterogeneous reaction necessary for the manufacture of high-purity silicon rods will increase, and therefore not only the yield thereof is reduced, but also the powdery silicon sometimes commingles with the growing high-purity silicon rods, thus reducing the quality of the latter as the raw material or element for float zone melting.

SUMMARY OF THE INVENTION

The present invention has been contemplated in view of the above-mentioned circumstances, and has for its object to provide a method for pyrolyzing monosilane thereby manufacturing high-purity silicon rods of a large diameter having an excellent quality at a high yield which is free from the above-mentioned disadvantage.

Another object of the present invention is to provide a method of manufacturing high-purity silicon rods by subjecting a silicon compound to pyrolysis on a plurality of rod-shaped high-purity silicon carrier members which have been red-heated by directly passing an electric current therethrough thereby depositing high-purity silicon thereon, characterized in that monosilane supplied into a pyrolysis container is subjected to pyrolysis on said rod-shaped and red-heated carrier members while insulating the radiant heat between them along the overall length thereof.

Still another object of the present invention is to provide an apparatus for manufacturing high-purity silicon rods by subjecting monosilane to pyrolysis on a plurality of rod-shaped, high-purity silicon carrier members which have been red-heated by directly passing an electric current therethrough. The apparatus comprises a plurality of electrodes each holding high-purity silicon carrier members and mounted within a pyrolysis container, said electrodes being held on the same base member, and a container surrounding said base member, and is characterized in that it comprises a thermal insulator which is adapted to arrange the high-purity silicon carrier members held on the same base member in equal space intervals and which is provided with a cooling means, said thermal insulator being located in the central part of the base member.

BRIEF DESCRIPTION OF THE DRAWINGS

Other objects, features and advantages of the present invention will be apparent from the following description in conjunction with the accompanying drawings in which.

DETAILED DESCRIPTION OF THE PREFERRED EMBODIMENTS

Figure 1:
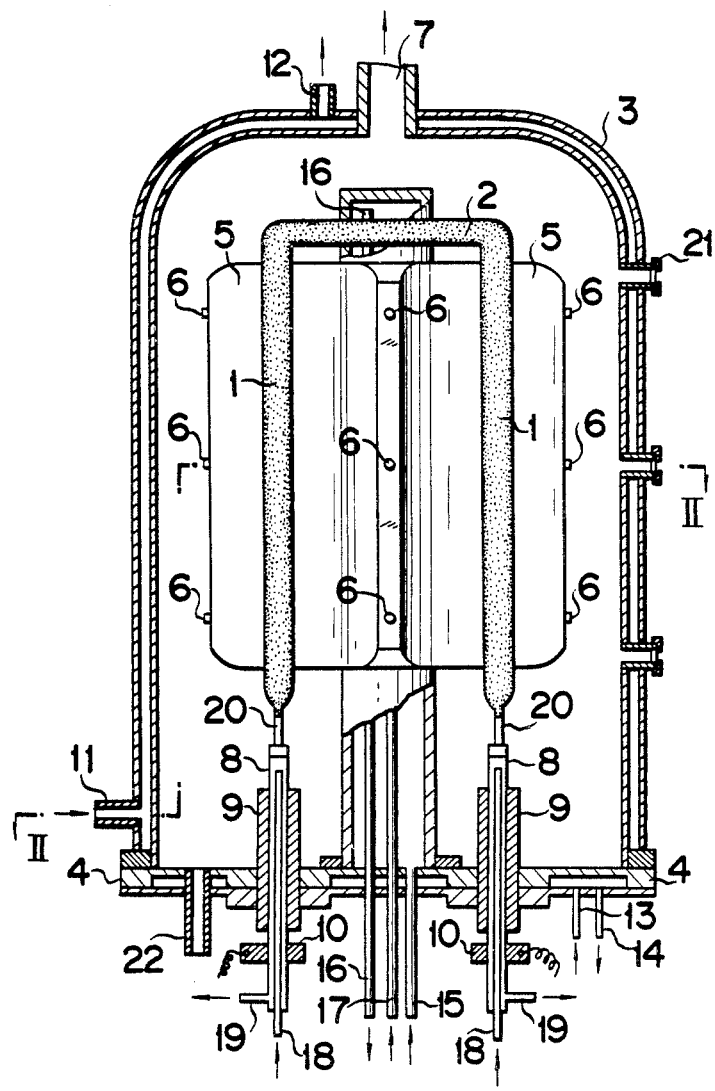
FIG. 1 is a schematic longitudinal sectional view showing an apparatus according to one embodiment of the present invention.
Figure 2:
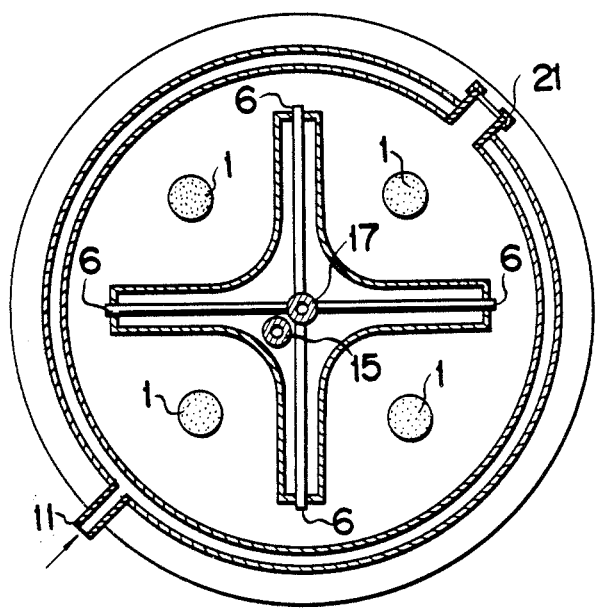
FIG. 2 is a sectional view of the same taken along line II—II in FIG. 1.

The present invention will now be described hereinafter by way of example only with reference to the accompanying drawings. As shown in FIGS. 1 and 2, the apparatus comprises a container 3 and a base member 4. The container 3 has a cavity formed therein and has an inlet pipe 11 and an outlet pipe 12 for coolant for cooling the entire container 3 from the lower part thereof. The container 3 is provided at the upper, central part thereof with an exhaust port 7 for venting the gas generated by thermal decomposition. Further, the container 3 is provided with windows 21 for observing high-purity silicon rods 1 being subjected to pyrolysis which are formed on the side thereof at three stages corresponding to the upper, intermediate and lower portions of the silicon rods 1. The base member 4 has a cavity formed therein so that it can be cooled by coolant flowing thereinto through a coolant inlet port 13 thereby to protect the base member 4 from the action of the heat generated during the pyrolysis. Reference numeral 14 denotes a coolant outlet port. Four sets of copper electrodes 8 for holding and heating the vertically extending high-purity silicon rods 1 as carrier members are fitted through thermal insulators 9 to the base member 4 in equal space intervals from one another and from the centre thereof. Each of the above-mentioned copper electrodes 8 is connected through a feeder 10 with a power source for heating (not shown). The lower part of each copper electrode 8 is cooled by coolant which flows thereinto through an inlet pipe 18 and flows out through an outlet pipe 19 thereby protecting the electrodes 8 from the action of the heat generated during the pyrolysis. Connected to the upper part of each of the copper electrodes 8 is a connection pole 20 made of tantalum.

The high-purity silicon rods 1 are connected to the connecting poles 20 made of tantalum, and the upper ends of the adjacent silicon rods 1 are connected to each other by a high-purity silicon rod 2. Mounted in the central part of the base member 4 is a thermal insulator 5 having a radially extending cross-section. Each radially extending part of the insulator 5 is located between the adjacent high-purity silicon rods 1 at equal space intervals from the silicon rods 1. The thermal insulator 5 has a cavity formed therein. A coolant inlet pipe 15 passing through the base member 4 is inserted in the cavity of the thermal insulator 5 so that the thermal insulator 5 can be cooled by the coolant which flows thereinto through the inlet pipe 15 and is discharged through a coolant outlet pipe 16. Further, inserted in the cavity of the thermal insulator 5 is a monosilane supply pipe 17 which passes through the base member 4. The monosilane supply pipe 17 is branched off into the upper, intermediate and lower stage supply pipes within the cavity of the thermal insulator 5, and the supply pipe of each stage is connected through a gas flow regulator to a gas flow divider where the supply pipe of each stage is branched off by the gas flow divider, the branch lines being connected, respectively, to monosilane supply ports 6 formed in three stages; that is, the upper, intermediate and lower stage supply ports formed at the leading ends of insulating plates of the thermal insulator 5. It is advantageous to use an automatic gas flow regulator as the above-mentioned gas flow regulator. Further, as for the gas flow divider, it is desirable to use one comprising a capillary tube and a filter for protecting the same and which can insure the accuracy of equal distribution of within several percents. A hot blast inlet pipe 22 is inserted through the base member 4 for supplying preheating hot blast into the container 3.

In the above-mentioned embodiment of the present invention, the gas flow regulator is mounted within the thermal insulator; however, it may be installed outside the apparatus, if required.

A method of manufacturing high-purity silicon rods by subjecting monosilane to pyrolysis by using the high-purity silicon rod manufacturing apparatus having the above-mentioned construction will now be described below.

One end of each of high-purity silicon rods 1 as carrier members to be manufactured is fixedly secured to a connecting pole 20 made of tantalum and is connected to a copper electrode 8, and the other ends of the adjacent silicon rods 1 are connected to each other by a high-purity silicon rod 2. Subsequently, the container 3 is mounted on the base member 4. After that, the exhaust port 7 provided on the upper part of the container 3 is connected to a valve in an exhaust system not shown provided with a vacuum forming system. The air inside the container 3 is drawn by a vacuum pump through a valve in the vacuum system until a predetermined degree of vacuum is reached. When the predetermined vacuum is reached, the valve in the vacuum forming system is shut off and air blast is sent through the air blast inlet pipe 22 into the container 3 to preheat the high-purity silicon rods 1. When a positive pressure is built up within the container 3, the above-mentioned valve in the exhaust system is opened, and the high-purity silicon rods 1 are heated until they reach a predetermined temperature. Prior to the above operation, cooling water is allowed to flow in through the coolant inlet pipes 11, 15 and 18 and the coolant inlet port 13 to cool the respective parts. When the high-purity silicon rods 1 have been heated to a predetermined temperature, the power is supplied from a power supply for heating through a feeder 10 to respective copper electrodes 8 until the silicon 1 reaches a temperature of more than 800° C. When the high-purity silicon rods 1 have been red-heated to a predetermined temperature by directly passing an electric current therethrough, the supply of the hot blast is cut off, and then monosilane is supplied through the supply pipe 17. The monosilane supplied through the supply pipe 17 can be controlled by the respective flow regulators at a predetermined flow rate, and is then supplied in equal amounts by the gas flow dividers into the container 3 through the four monosilane supply ports 6 formed at each stage. The monosilane supplied into the container 3 is subjected to pyrolysis on the red-heated, high-purity silicon rods 1 so as to deposit the high-purity silicon thereon. The condition of thermal decomposition of the high-purity silicon rods 1 can be observed through the observation windows 21. Even when each of the silicon rods 1 which are arranged at equal space intervals from the thermal insulator 5 is increased in diameter by the pyrolysis reaction, it is not subjected to the radiant heat emitted by other red-heated, high-purity silicon rods 1, and therefore it is not affected by the homogeneous reaction in gaseous phase. Thus, such effect can be obtained as the diameter of each high-purity silicon rod in the cross-section thereof can be kept uniformly in the longitudinal direction even if the diameter thereof increases.

Further, since the homogeneous reaction in gaseous phase can be controlled, the productivity and yield can be increased and also the quality of the product can be improved.

Next, the experimental result of the present invention is described below.

EXAMPLE 1

Four pieces of rod-shaped, high-purity silicon carrier members, each having a diameter of 5 mm and a length of 1,200 mm, were arranged within the pyrolysis container in a manner of extending vertically and spacing apart from one another and from the centre of the container at equal distances. The upper ends of each pair of the carrier members were connected with each other by a silicon rod having a diameter of 5 mm and a length of 300 mm and having a resistivity of 50 $\Omega$cm. A thermal insulator having the same shape as that shown in the accompanying drawing was employed between the carrier members as shown in the drawings. After preheating by the hot blast, the silicon carrier members were kept at a temperature of about 850° C. as in the case of the conventional process and monosilane was supplied into the pyrolysis container through all the upper, intermediate and lower monosilane supply ports formed at the leading ends of thermal insulating plates of the thermal insulator so that it was subjected to pyrolysis on the red-heated carrier members. The speed of deposition of silicon on the surfaces of the carrier members was kept at 4 to 8 $\mu$m/min as in the case of the conventional process, such condition being kept until the diameter of each silicon rod reaches 60 mm. Consequently, the time for pyrolysis required until the diameter of each silicon rod reaches 60 mm could be reduced by about 10% from that in case of the conventional process. The polycrystal silicon rods thus obtained were fused by the float zone refining process and the mono-crystallization for them could be improved by about 30%.

EXAMPLE 2

When high-purity silicon rods, each having a diameter of 60 mm, were manufactured at a pyrolysis temperature of about 900° C. and a deposition speed higher than that in Example 1 by about 25%, as compared with the conventional process, the time for pyrolysis could be shortened by about 23%. The condition of mono-crystallization of the rod-shaped, polycrystal silicon by the float zone melting process was approximately the same as that in case of Example 1.

EXAMPLE 3

When high-purity silicon rods each having a diameter of 100 mm were manufactured under the same condition as that in Example 1, and the time for pyrolysis could be shortened by about 25% as compared with that in the conventional process. Although the product obtained by the conventional process contained powdery silicon formed by the homogeneous reaction in gaseous phase, no such phenomenon was seen in the products produced as shown in this example.

EXAMPLE 4

High-purity silicon rods each having a diameter of 60 mm were manufactured under the condition that twelve units of rod-shaped silicon carrier members were subjected to pyrolysis at the same time and the carrier members were separated by a thermal insulator into four groups, one of which contains therein three units of the carrier members arranged within a separated space in the pyrolysis container. As a result, as compared with the case using no thermal insulator, the time for use in pyrolysis could be shortened by about 6%, and the yield of the product was improved by about 4%.

On the occasion of putting the present invention in practice, a cooled thermal insulator is placed between the red-heated silicon rods so that they are not subjected to the radiant heat between them. The thermal insulator may be made by the same material as that of the container which accommodates rod-shaped, high-purity silicon carrier members, and the thermal insulator is cooled in the same manner as that of the container. Both the container and thermal insulator may be cooled by water or coolant, the temperature of which can be controlled. The thermal insulator should desirably have a enough length so that a greater part of the red-heated silicon rods are not subjected to the radiant heat and should preferably be installed in such a manner as to equally separate the container into some sections by the insulator. In the case where a multiplicity of rod-shaped, high-purity silicon carrier members are located within the container, it is not always necessary to thermally insulate each of them separately; instead the thermal insulator may be put under the above-mentioned condition so that two or three units of the carrier members can be grouped. In supplying monosilane into the container, it is advantageous to do it in equal amounts along the overall length of the carrier members.

As described in detail hereinabove, according to the present invention, the homogeneous reaction in vapor phase which tends to generate when monosilane gas is subjected to pyrolysis on the red-heated silicon rods can be stopped or restrained. Therefore, with the increase of the diameter of the high-purity silicon rods while being manufactured, the diameter thereof can be made uniform and also the high-purity silicon rods can be obtained at a high yield. Moreover, the amount of deposition of silicon per unit time can be increased. Such tendency will be become more conspicuous with the increase of the diameter of the high-purity silicon rods, and the amount of the powdery silicon mixing with the silicon rods can be reduced to almost nil. Therefore, the quality of the product can be improved as a raw material for the float zone melting process and single-crystallization can be easily effected enabling thereby to produce high-purity single-crystal having a uniform characteristic.

It is to be understood that the foregoing description is merely illustrative of the invention and that the scope of the invention is not to be limited thereto, but is to be determined by the scope of the appended claims.

What is claimed is:

1. A method of manufacturing high-purity, silicon rods by subjecting a silicon compound to pyrolysis on a plurality of rod-shaped high-purity silicon carrier members which have been red-heated by directly passing an electric current therethrough thereby depositing high-purity silicon thereon, characterized in that monosilane supplied into a pyrolysis container is subjected to pyrolysis on said red-heated carrier members while insulating the radiation heat between said carrier members along the overall length thereof.

2. The method as claimed in claim 1, wherein said plurality of red-heated high-purity silicon carrier members are subjected to thermal insulation by a thermal insulator located at equal space intervals from them.

3. The method as claimed in claim 1, wherein each of said plurality of red-heated, high-purity silicon carrier members is thermally insulated by a thermal insulator.

4. The method as claimed in claim 1, wherein monosilane is supplied into a pyrolysis container through leading ends of each of thermally insulating plates of the thermal insulator.

5. The method as claimed in claim 4, wherein monosilane is supplied into a pyrolysis container through upper, intermediate and lower stage supply ports formed at the leading ends of thermal insulating plates of the thermal insulator.

6. The method as claimed in claim 5, wherein monosilane is supplied in equal amounts through the upper, intermediate and lower monosilane supply ports.

* * * * *